(12) United States Patent
Kim et al.

(10) Patent No.: US 6,503,829 B2
(45) Date of Patent: Jan. 7, 2003

(54) METAL VIA CONTACT OF A SEMICONDUCTOR DEVICE AND METHOD FOR FABRICATING THE SAME

(75) Inventors: Won-Jin Kim, Suwon (KR); Seong-Ho Kim, Yongin (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 49 days.

(21) Appl. No.: 09/812,564

(22) Filed: Mar. 21, 2001

(65) Prior Publication Data

US 2002/0022361 A1 Feb. 21, 2002

(30) Foreign Application Priority Data

Aug. 19, 2000 (KR) ........................................ 2000-48089

(51) Int. Cl.$^7$ ............................................... H01L 21/44
(52) U.S. Cl. ...................... 438/637; 438/701; 438/618; 438/669
(58) Field of Search ................................ 438/637, 640, 438/618, 629, 639, 700, 701, 725

(56) References Cited

U.S. PATENT DOCUMENTS

| | | | |
|---|---|---|---|
| 5,895,937 A | * 4/1999 | Su et al. | 257/347 |
| 5,968,851 A | * 10/1999 | Geha et al. | 438/700 |
| 6,191,031 B1 | * 2/2001 | Taguchi et al. | 438/638 |
| 6,200,906 B1 | * 3/2001 | Batra et al. | 438/708 |
| 6,258,729 B1 | * 7/2001 | DeBoer et al. | 438/640 |
| 6,335,275 B1 | * 1/2002 | Yabata et al. | 438/639 |
| 6,385,842 B1 | * 3/2002 | Zhou et al. | 438/596 |

FOREIGN PATENT DOCUMENTS

| | | |
|---|---|---|
| KR | 1997-026317 | 1/1999 |
| KR | 1998-00967 | 8/1999 |

* cited by examiner

*Primary Examiner*—Wael Fahmy
*Assistant Examiner*—Fernando Toledo
(74) *Attorney, Agent, or Firm*—Lee & Sterba, P.C.

(57) ABSTRACT

A metal via contact of a semiconductor device and a method for fabricating the same, wherein the method includes sequentially forming a first insulating layer, a low dielectric SOG (Spin On Glass) layer, a second insulating layer and a silicon oxynitride (SiON) layer on a semiconductor substrate forming a photoresist pattern, using the photoresist pattern as an etching mask and wet etching the silicon oxynitride layer and a portion of the second insulating layer, using the same photoresist pattern as an etching mask and anisotropically etching remainder second insulating layer, the low dielectric SOG layer and the first insulating layer to form a via hole exposing a predetermined portion of the semiconductor substrate, removing the photoresist pattern, using radio frequency (RF) etching to remove a reverse slope of the via hole and forming a metal plug in the via hole.

7 Claims, 4 Drawing Sheets

METAL VIA CONTACT OF A SEMICONDUCTOR DEVICE AND METHOD FOR FABRICATING THE SAME

BACKGROUND OF THE INVENTION

1. Field of the Invention

The present invention relates to a semiconductor device and a method for fabricating the same. More particularly, the present invention relates to a metal via contact of a semiconductor device and a method for fabricating the same.

2. Description of Background Art

As integration density of an integrated circuit device increases, the size of a semiconductor device and interconnection lines thereon becomes smaller and smaller. In order to build more semiconductor devices in a given cell plane with reduced area, three-dimensional semiconductor devices and interconnection lines are being employed. A three-dimensional interconnection line is typically shown in multi-level metallization. Multi-level metallization is carried out as a post-process after a preprocess such as forming a transistor, forming a capacitor and forming a bit line.

An insulator having a low dielectric constant is employed as an interlayer insulating layer formed in the post-process in order to reduce a parasitic capacitance due to metal lines in the same or a different layer. However, in general, the low dielectric layer has a poor gap filling characteristic due to its poor adhesion characteristic to the stepped-underlying layer. In order to avoid the above-mentioned problems, a wetting layer such as a TEOS (Tetra Ethylene Ortho-Silicate) layer is interposed as a base layer between the underlying layer and the low dielectric layer for improving adhesion characteristics. Generally, a HSQ (Hydro SilsesQuioxane) layer by SOG (spin on glass) method is employed as the low dielectric layer. However, hydrogen of the HSQ layer interacts with oxygen from an ashing process for a photoresist pattern used as an etching mask for a contact hole in the interlayer insulating layer. As a result, a crack or the like can occur in the interlayer insulating layer due to water out-diffusion. Therefore, capping the insulating layer as for etching mask or hard mask such as a PE-TEOS (plasma enhanced Tetra Ethylene Ortho-Silicate) layer is additionally formed on the low dielectric layer. After all, a triple layer structure of interlayer insulating layer is used in the low dielectric layer application. Namely, a base layer, a low dielectric layer, and a capping layer structure is employed as the interlayer insulating layer.

In multi-level metallization, aluminium or an aluminium alloy is generally used as a metal line due to its excellent electrical characteristic. For interconnection between metal lines at different level layers, a via hole is formed in the insulator interposed between the metal lines. At this time, the via hole is formed in advance by patterning the insulator to expose a lower metal line. Aluminium is then deposited in the via hole by a sputtering technique and reflowed. However, a recent trend toward high integration density in the semiconductor industry increases the height of the via hole but decreases the aperture of the contact hole, thereby increasing the aspect ratio (ratio of the height to width). As a result, the aluminium cannot fill the deep and narrow contact hole completely, causing a void. Thus, contact resistance is increased or the metal line is cut off.

The low dielectric layer, such as SOG, is relatively fast etched as compared to the base layer and the capping layer. Accordingly, a bowing phenomenon (i.e., the sidewall of the low dielectric layer becomes concave) can occur in a sidewall of the low dielectric layer due to its high etching rate during the etching the triple layer interlayer insulating layer and due to oxygen caused by subsequent plasma ashing.

Bowing of the low dielectric layer results in a reverse slope in the sidewall of the via hole, particularly at the upper half of the bowing part. The reverse slope makes it difficult to fill the via hole completely. FIG. 1 schematically illustrates a semiconductor substrate having a metal via contact as known in the prior art. A PE-TEOS layer 11, a low dielectric layer 13 and a PE-TEOS layer 15 are stacked on a semiconductor substrate 10 sequentially. Due to the bowing phenomenon 21 of the low dielectric layer 13, the metal via contact 17 has a void 19.

Methods for preventing or curing the bowing phenomenon are well-known and are disclosed in some patents, for example, Korean Patent Nos. 1998-000967 and 1997-026317, the disclosures of which are hereby incorporated herein by reference. According to above-cited patents, a radio frequency (RF) etching is carried out in the presence of the photoresist pattern. Accordingly, the photoresist pattern is hard to remove. In addition, when the via hole is formed by only anisotropic etching, overhang can occur in the process of sputtering due to a smaller aperture size of the hole. If the RF etching is carried out after the photoresist pattern is formed, the top portion of the via hole may be over-etched thereby enlarging the aperture size of the via hole to an unacceptable value. This enlargement of the aperture size to an unacceptable value can cause an electrical bridge between adjacent metal lines.

SUMMARY OF THE INVENTION

It is a feature of an embodiment of the present invention to provide a metal via contact without a void and a method for fabricating the metal via contact.

It is another feature of an embodiment of the present invention to provide a metal via contact without an electrical bridge between adjacent metal lines and a method for fabricating the metal via contact.

In order to solve the aforementioned problems and provide the above and other features of the present invention, a metal via contact of a semiconductor device is provided. The semiconductor device includes a multi-layer structure of an interlayer insulating layer comprising an interlayer insulating layer including a first insulating, a low dielectric SOG (Spin On Glass) layer, a second insulating layer and a silicon oxynitride layer formed in that order on a semiconductor substrate, and a metal via contact formed in the interlayer insulating layer, and tapered from a top surface of the interlayer insulating layer to a bottom surface of the interlayer insulating layer and formed by a sputtering technique.

The first and second insulating layers are formed of a CVD silicon oxide layer. Preferably, the first and second insulating layers are formed of PE-TEOS oxide layer. Preferably, the low dielectric SOG layer is formed of Hydro SilsesQuioxane (HSQ).

In order to solve the aforementioned problems and provide the above and other features of the present invention, a method for fabricating a metal via contact of a semiconductor device is provided. The method includes sequentially forming a first insulating layer, a low dielectric SOG (Spin On Glass) layer, a second insulating layer and a silicon oxynitride (SiON) layer on a semiconductor substrate forming a photoresist pattern; using the photoresist pattern as an etching mask and wet etching the silicon oxynitride layer and a portion of the second insulating layer; using the same photoresist pattern as an etching mask and anisotropically etching a remaining portion of the second insulating layer, the low dielectric SOG layer and the first insulating layer to form a via hole exposing a predetermined portion of the semiconductor substrate; removing the photoresist pattern; using radio frequency (RF) etching to remove a reverse slope of the via hole; and forming a metal plug in the via hole.

In an alternate embodiment of the present invention, the removal of the photoresist pattern is carried out by ashing or a combination of ashing and stripping. The radio frequency (RF) etching continues until the silicon oxynitride layer is completely removed. The formation of the metal plug comprises sputtering and heat reflow techniques. The sputtering technique uses aluminium as a sputtering source. At this time, the radio frequency (RF) etching is carried out in a sputtering apparatus for the metal plug, thereby providing an in-situ process for the radio frequency etching and forming the metal plug. The radio frequency (RF) etching is carried out so as not to enlarge a top width of the via hole beyond an undercut portion.

These and other features and advantages of the invention will be readily apparent to those of ordinary skill in the art upon review of the detailed description that follows.

BRIEF DESCRIPTION OF THE DRAWINGS

The invention may be understood and its features and advantages will become apparent to those skilled in the art by reference to the accompanying drawings as follows, wherein.

DETAILED DESCRIPTION OF THE PREFERRED EMBODIMENTS

Figure 1:
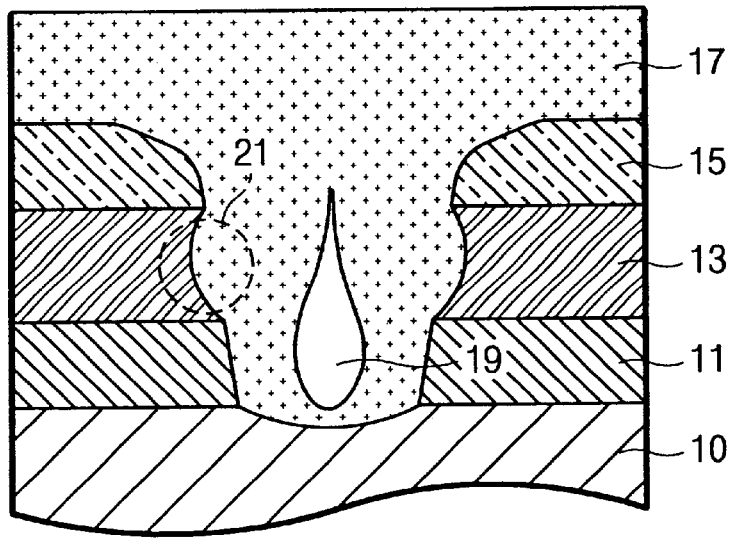
FIG. 1 schematically illustrates a semiconductor substrate having a metal via contact as known in the prior art.

This application claims priority from Korean Patent Application No. 2000-48089, filed on Aug. 19, 2000, and entitled: "Metal Via Contact of a Semiconductor Device and Method of Fabricating Thereof." In addition, the contents of that Korean patent application are incorporated by reference herein in their entirety.

The present invention will now be described in detail with reference to the accompanying drawings, in which preferred embodiments of the invention are shown. This invention may, however, be embodied in different forms and should not be construed as limited to the embodiments set forth herein. In that, the preferred embodiments are provided so that this disclosure will be thorough and complete, and will fully convey the scope of the invention to those skilled in the art. In the drawings, the thickness of layers and regions are exaggerated for clarity.

Figure 2:
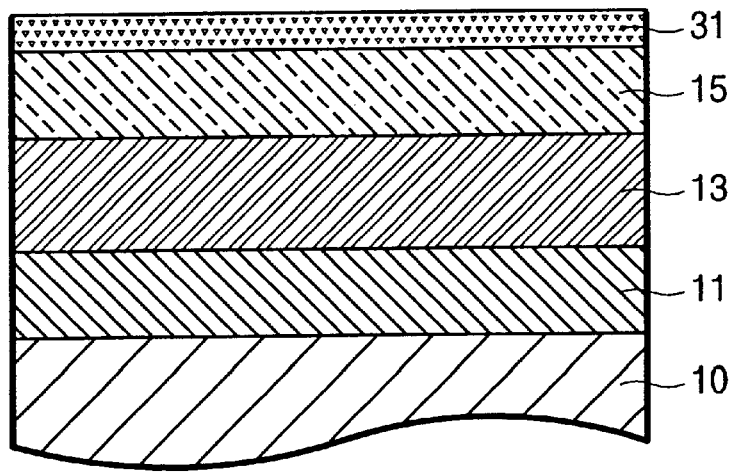
FIGS. 2 to 7 illustrate a series of cross-section al views of a semiconductor substrate at selected stages of fabricating a metal via contact of a semiconductor device according to the present invention.

FIG. 2 schematically illustrates a cross-sectional view of a semiconductor substrate already having undergone several process steps in accordance with the present invention. A PE-TEOS layer 11, a low dielectric SOG layer 13, a PE-TEOS layer 15 and a silicon oxynitride layer 31 are stacked on a semiconductor substrate 10 in that order. Typically, the low dielectric SOG layer 13 is made of HSG (Hydro SilsesQuioxane), however, FOx®, HOSP®, Nano Glass® or the like can also be used. The low dielectric layer refers to an insulator that has a dielectric constant lower than a conventional insulating layer, such as silicon dioxide having a dielectric constant of about 4. The dielectric constant of the low dielectric layer is generally about 3.7 or less, and preferably is 3.3 or less. In addition to the above, SiOF may also be used.

The PE-TEOS layer 11 is used as a wetting layer for improving adhesion characteristics of the low dielectric layer to the underlying layer. For example, the PE-TEOS wetting layer 11 is formed to a thickness of approximately several hundred to several thousand angstroms. The low dielectric layer 13 is formed by a SOG (Spin on glass) method. The low dielectric layer is deposited to a thickness of about several hundred angstroms and its thickness can be controlled by a speed of a spinner. The deposited low dielectric layer 13 is subject to a soft bake at a temperature of about 100° C. to 300° C. to remove moisture and solvent, and then subject to annealing at a temperature of about 400° C. for about 30 minutes to solidify the layer. The PE-TEOS layer 15 is formed to a thickness of about 1000 to 3000 angstroms.

The silicon oxynitride layer 31 is formed to a thickness of about several hundred angstroms. It is preferable that the thickness of the silicon oxynitride layer 31 be controlled such that the silicon oxynitride layer 31 is removed after subsequent RF etching. Namely, the silicon oxynitride layer 31 serves as an RF mask for preventing the lateral etching of the underlying layer, and is finally removed after RF etching.

Figure 3:
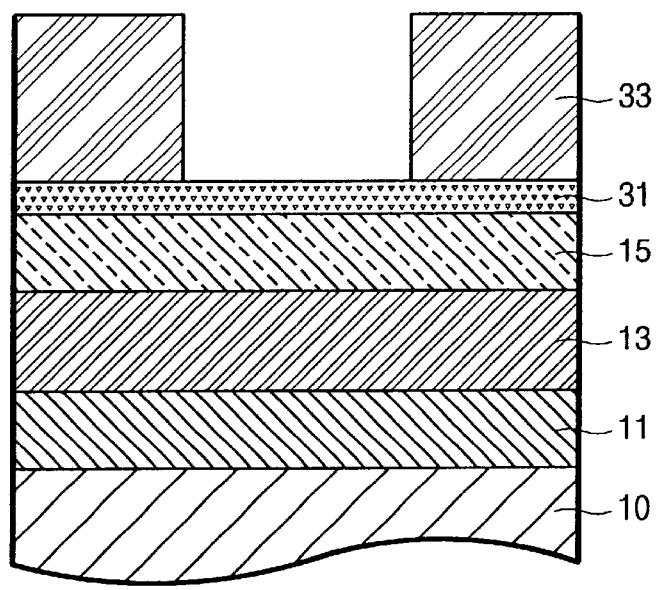

Referring now to FIG. 3, a photoresist pattern 33 defining a via hole is formed on the silicon oxynitride layer 31. The photoresist pattern 33 is formed by a conventional process, including exposing and developing. At this time, the above-mentioned silicon oxynitride layer 31 also serves as an anti-reflection coating layer.

Figure 4:
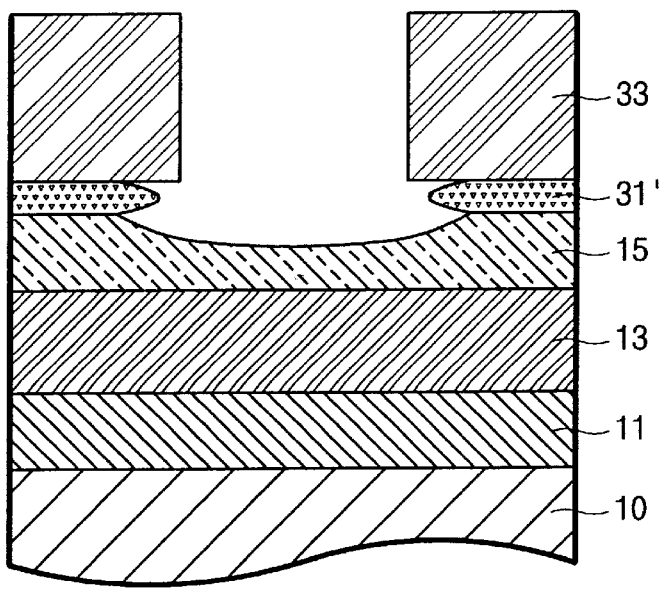

Referring to FIG. 4, using the photoresist pattern 33 as an etching mask, a wet etching is initially carried out to define a hole. The wet etching is carefully controlled to etch the silicon oxynitride layer 31 and a part of the PE-TEOS layer 15. Since the etching rate of the PE-TEOS layer 15 is faster than the silicon oxynitride layer 31, the PE-TEOS layer 15 is undercut under the etched silicon oxynitride layer 31'. Due to isotropic etching characteristics, wet etching also undercuts the silicon oxynitride layer 31 under the photoresist pattern 33. Due to undercut, the etched silicon oxynitride layer 31' is relatively thin at a periphery of the hole. Wet etching typically uses a LAL solution. Conventional wet etching using LAL solution is carried out for about 30 to 60 seconds. For completely removing the silicon oxynitride layer 31 and undercutting the PE-TEOS layer 15, wet etching is carried out for approximately 100 seconds or more.

Figure 5:
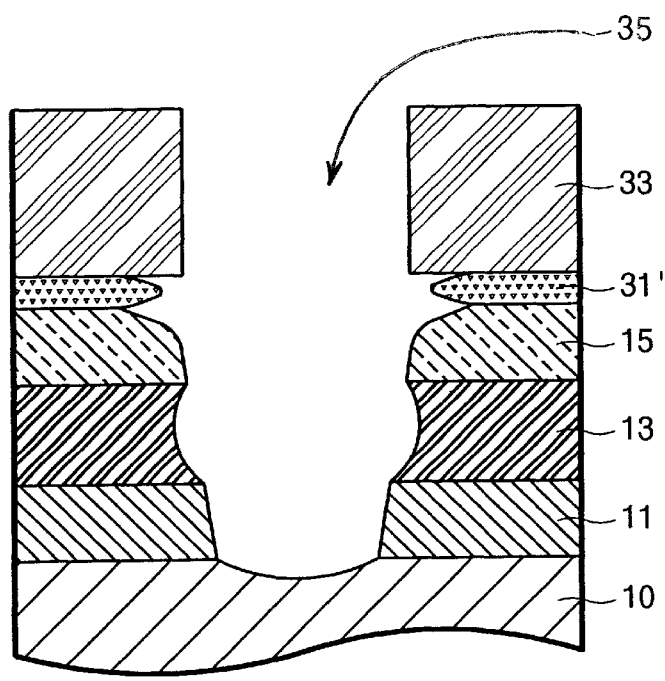

Referring to FIG. 5, without removing the photoresist pattern 33, the remainder of the PE-TEOS layer 15, the low dielectric SOG layer 13 and the PE-TEOS layer 11 are anisotropically etched by dry etching to form a via hole 35. The dry etching uses a RIE (reactive ion etching) technique, wherein plasma is generated, accelerated to a predetermined direction by an electric field and collided with the layer to be etched for improving etching efficiency. The structure of the low dielectric SOG layer 13 is loose as compared to the underlying and overlying PE-TEOS layers 11 and 15 and thereby has a relatively high etching rate. As a result, a reverse slope can occur in the low dielectric SOG layer 13. Accordingly, a laterally concave portion is generated (through the so-called bowing phenomenon) in the low dielectric SOG layer 13.

The photoresist pattern 33 is removed through ashing or a combination of ashing and stripping. At this time, oxygen introduced during the ashing process can react with hydrogen or carbon contained in the low dielectric SOG layer 13 to form moisture or carbonic acid gas. In addition, moisture can out-diffuse at a high temperature to change the configuration of the layer, for example, to shrink the layer, thereby correcting the bowing phenomenon.

Figure 6:
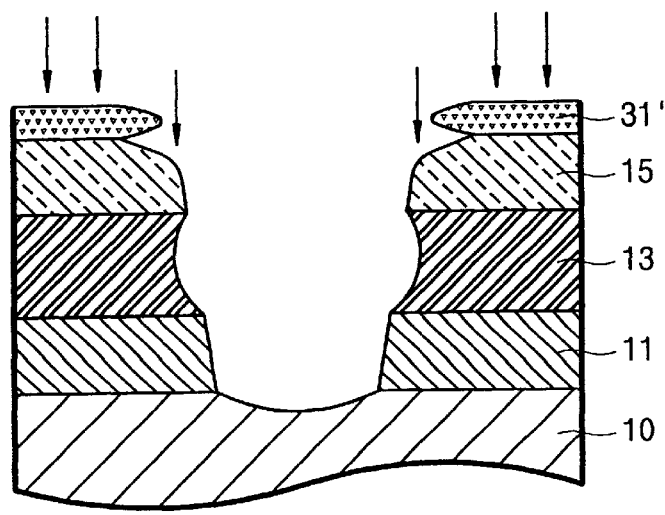

Referring now to FIG. 6, after removing the photoresist pattern 33, a sputtering apparatus (depicted by the arrows) is introduced to the semiconductor substrate 10, which has undergone the via hole etching, including wet and dry etching.

Conventionally, prior to sputtering deposition, sputtering etching or RF etching is carried out in order to clean the via hole. RF etching conventionally is more concentrated on relatively convex portions than other portions, and thus enlarges the entrance part of the hole. In the case of sputtering deposition with well-controlled RF power and direction of the electric field, deposition and etching are repeatedly carried out to deposit a material on a relatively concave portion, thereby relaxing the slope of the step portion.

Thus, according to an embodiment of the present invention, etching is carried out on the etched silicon oxynitride layer 31' covering most of the substrate. Though the etched silicon oxynitride layer 31' is thin, the entrance part of the via hole is covered by the silicon oxynitride layer 31', which prevents the entrance part from being widened beyond the width of the undercut portion in the PE-TEOS layer 15. On the other hand, inside of the via hole, the etching function is concentrated on the convex portion (i.e., the protruding part) of the sidewall. Thus, the upper part of reverse slope portion in the bowing and the other protruding parts are etched rapidly and the width of these parts gradually increases. Accordingly, the entire shape of the slope of the via hole sidewall approaches a linear shape of average slope, and thus the slope becomes relaxed.

As the RF etching continues, the etched silicon nitride layer 31' covering the substrate is consumed, and the relatively thin nitride layer at the peripheral region of the via hole starts to be etched, thereby widening the width of the via hole. At this time, since etching is carried out on the undercut and slightly sloped part, the degree of the slope is sharply changed in order for the slope of the entire via hole to be linear. When the width of the via hole entrance reaches the enlarged width of the via hole caused by the undercut, the etched silicon nitride layer 31' is almost entirely consumed. Namely, the etched silicon nitride layer 31' prevents the TEOS layer 15 from being laterally etched beyond the undercut.

When the etched silicon nitride layer 31' is entirely consumed, the entrance of the via hole can be further enlarged slowly, thereby making discrimination of the upper wiring difficult. Accordingly, it is required that the maximum width of the via hole not be beyond the undercut width by the wet etching. The process is carefully controlled to stop RF etching when the maximum width of the via hole reaches the undercut width. Conventional RF etching for cleaning process is carried out for about several tens of seconds. However, according to an embodiment of the present invention, RF etching continues for approximately one to two minutes in order to flatten the sidewall profile of the via hole. For example, the RF etching is carried out by using a sputtering source gas such as argon with 6 sccm (standard cubic centimetres per minute), at room temperature, at a power of about 400 W, for one minute.

Any silicon nitride remaining after the RF etching can be removed by additional etching. Alternatively, the remainder of the silicon nitride need not be removed since it is an insulator and negligible.

Figure 7:
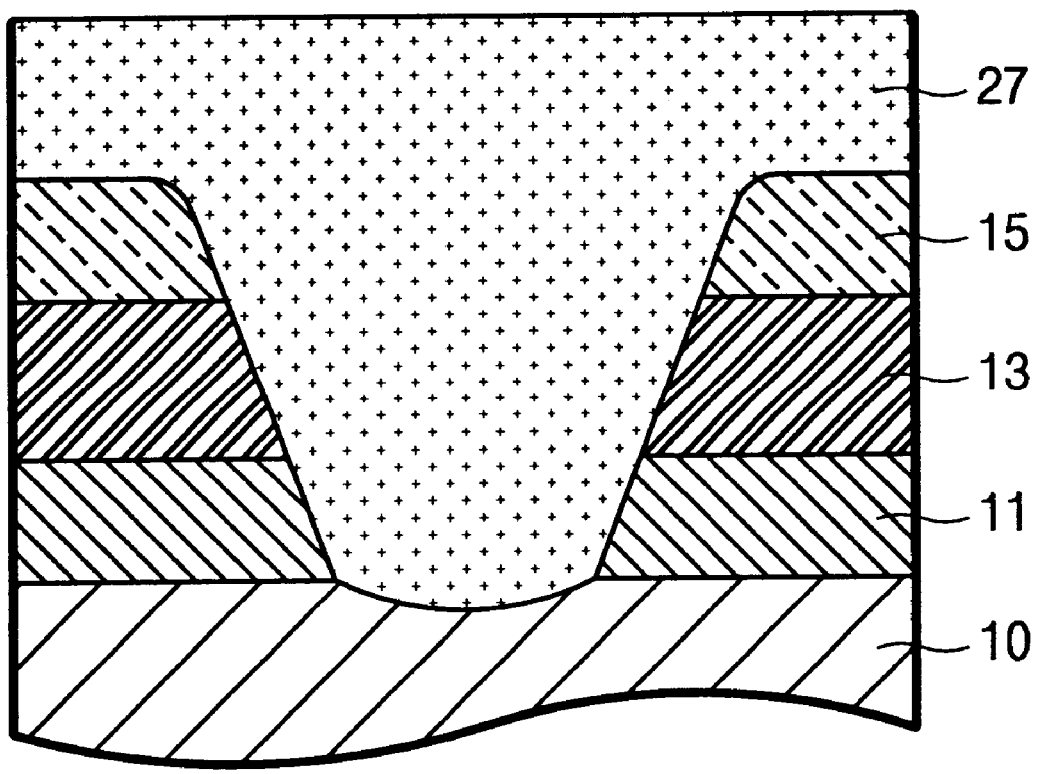

Referring now to FIG. 7, after flattening the sidewall of the via hole (i.e., the slope of the sidewall of the via hole), a metal layer 27 such as aluminium is deposited in the via hole via the same sputtering apparatus. Since the via decreases in width from top to bottom, any overhang phenomenon is decreased and the aluminium easily fills the entire via hole though a heat reflow process. A barrier metal such as titanium, and titanium nitride layer can be formed prior to sputtering the aluminium. After filling the via hole, an upper wiring is formed by a pattering process.

According to an embodiment of the present invention, the via hole has an excellent sidewall profile in the low dielectric SOG interlayer insulating layer application for reduced parasitic capacitance, thereby providing a reliable semiconductor device.

While the present invention has been described in terms of preferred embodiments, those of ordinary skill in the art will recognize that various modifications may be made to the invention without departing from the spirit and scope thereof.

What is claimed is:

1. A method for fabricating a semiconductor device, the method comprising:

sequentially forming a first insulating layer, a low dielectric SOG (Spin On Glass) layer, a second insulating layer and a silicon oxynitride (SiON) layer on a semiconductor substrate;

forming a photoresist pattern;

using the photoresist pattern as an etching mask and wet etching the silicon oxynitride layer and a portion of the second insulating layer;

using the same photoresist pattern as an etching mask and anisotropically etching a remaining portion of the second insulating layer, the low dielectric SOG layer and the first insulating layer to form a via hole exposing a predetermined portion of the semiconductor substrate;

removing the photoresist pattern; using radio frequency (RF) etching to remove a reverse slope of the via hole; and forming a metal plug in the via hole.

2. The method according to claim 1, wherein removing the photoresist pattern is carried out by a process selected from the group consisting of ashing and a combination of ashing and stripping.

3. The method according to claim 1, wherein radio frequency (RF) etching continues until the silicon oxynitride layer is completely removed.

4. The method according to claim 1, wherein forming the metal plug comprises sputtering and heat reflow techniques.

5. The method according to claim 4, wherein the sputtering technique uses aluminium as a sputtering source.

6. The method according to claim 4, wherein radio frequency (RF) etching is carried out in a sputtering apparatus for the metal plug, thereby providing an in-situ process for the radio frequency etching and the metal plug.

7. The method according to claim 1, wherein radio frequency (RF) etching is carried out so as not to enlarge a top width of the via hole beyond an undercut portion.

* * * * *